United States Patent [19]
Chakraborty et al.

[11] Patent Number: 5,711,698
[45] Date of Patent: Jan. 27, 1998

[54] METHOD OF SYNTHETIC DIAMOND ABLATION WITH AN OXYGEN PLASMA AND SYNTHETIC DIAMONDS ETCHED ACCORDINGLY

[75] Inventors: Rabindra N. Chakraborty, East Lansing, Mich.; Michael J. Ferrecchia; Paul D. Goldman, both of Marlboro, Mass.; Donnie K. Reinhard, East Lansing, Mich.

[73] Assignee: Saint-Gobain/Norton Industrial Ceramics Corp, Worcester, Mass.

[21] Appl. No.: 437,102

[22] Filed: May 5, 1995

[51] Int. Cl.⁶ .................................................. B24B 1/00
[52] U.S. Cl. ........................ 451/41; 451/54; 51/295; 125/30.01
[58] Field of Search ........................... 451/41, 28, 54; 125/30.01, 1; 156/636.1, 645.1; 216/52, 38, 39; 51/295, 307

[56] References Cited

U.S. PATENT DOCUMENTS 5,472,370  12/1995  Malshe et al. ........................... 451/41

FOREIGN PATENT DOCUMENTS

| 419087 | 3/1991 | European Pat. Off. . |
| 615004A1 | 3/1994 | European Pat. Off. . |
| 64-62484 | 3/1989 | Japan .................... C23F 4/00 |
| 2281254 | 3/1995 | United Kingdom . |

OTHER PUBLICATIONS

Presented at Diamond Films '95, Barcelona, 1995, "ECR Plasma Polishing of CVD Diamond Films", H. Buchkremer-Hermanns, C. Long, H. Weiß, Laboratory of Surface Engineering, Institute of Materials Technology, University of Siegen Paul-Bonatz Str. 9–11, 57068 Siegen, Germany, pp. 1–6.

*Primary Examiner*—Robert A. Rose
*Attorney, Agent, or Firm*—Volker R. Ulbrich; David P. Gordon

[57] ABSTRACT

A method for ablating a synthetic diamond having a pitted surface includes applying a colloidal graphite to the surface of the diamond and subjecting it to an oxygen plasma so that preferably approximately 50 microns are removed from the surface of the synthetic diamond. The resulting surface of the diamond is virtually pit free. Preferably, the diamond is then mechanically lapped for finishing.

22 Claims, 2 Drawing Sheets

METHOD OF SYNTHETIC DIAMOND ABLATION WITH AN OXYGEN PLASMA AND SYNTHETIC DIAMONDS ETCHED ACCORDINGLY

BACKGROUND OF THE INVENTION

1. Field of the Invention

The invention relates to the etching of synthetic diamond in an oxygen plasma. More particularly, the invention relates to methods of coating a synthetic diamond prior to plasma etching such that the density and depth of surface pits in the diamond are reduced subsequent to plasma etching and to finished diamonds prepared in this manner.

2. State of the Art

A diamond is an allotrope of carbon exhibiting a crystallographic network of exclusively covalently bonded, aliphatic $sp^3$ hybridized carbon atoms arranged tetrahedrally with a uniform distance of 1.545 Å between atoms. Due to this structure, diamonds are extremely hard and have a thermal conductivity approximately four times that of copper while being an electrical insulator. Although diamonds are most popularly known for their gemstone qualities, their hardness, thermal and electrical properties make them very useful for many industrial applications.

Naturally occurring diamonds are believed to be the result of pure carbon having been subjected to tremendous pressure and heat deep within the earth. Synthetic, or man-made, diamonds became possible in 1955, when the General Electric Company used laboratory equipment to subject graphite to great pressure and heat. Today, diamonds can be grown as an equilibrium phase at high pressures or under metastable conditions at low pressures. One of the methods developed in recent years for producing diamonds is known as chemical vapor deposition (CVD). CVD methods use a mixture of hydrogen and a gaseous carbon compound such as methane which is activated and contacted with a substrate to produce a diamond film or wafer on the substrate. The hydrogen gas is dissociated into atomic hydrogen and then reacted with the carbon compound to form condensable carbon radicals including elemental carbon. The carbon radicals are then deposited on a substrate to form a diamond film.

One of the persistent undesired features of diamond wafers manufactured by CVD is that of large surface irregularities (pits). For most applications, it is necessary to smooth or polish (ablate) the surface of the diamond film to obtain the proper thickness tolerance and/or surface finish. Due to the extreme hardness of diamond, specialized tools are required for accurately machining the surface of the diamond film to the desired finish. Typical methods for mechanical diamond finishing involve abrading the diamond film with a diamond grit slurry on a lapping machine. These methods tend to be costly and time consuming, often entailing ablating rates of about 0.1 µm/hr to 0.1 µm/min and requiring up to several months to finish a four inch diameter diamond wafer.

It is also known in the art to use a laser or other high energy beam to ablate the surface of a diamond film in order to achieve a desired finish. The use of lasers and similar high energy beams is in very early stages of development. While these methods promise to be less time-consuming and more accurate, they can often generate defects in the diamond. In general, laser ablation is accomplished by irradiating the surface of the diamond with a laser beam at an angle, such that the convex irregularities on the surface are exposed to a higher laser power density than the planar areas, and the concave irregularities are shielded by the convex ones. The surface of the diamond undergoes several passes under the laser to evenly smooth the surface and the laser typically removes from 10 to 40 microns of diamond per pass under the laser. The result is that a maximum convexity height (Rmax) of 50 µm on the surface of a diamond can be reduced to 3 µm within a relatively short period of time. It is difficult to obtain any particular level of surface smoothness, however, unless the surface of the diamond film is ablated in very small increments and separately measured after each ablation. Moreover, while a significant depth of diamond is removed during each pass under the laser, a typical 100 mm wafer must be subjected to many passes before its entire surface is ablated.

Recently, diamond films and wafers have been used in microelectronic applications as heat sinks or substrates for semiconductor devices. In these applications, it is often necessary to etch the surface of the diamond. A current technique for etching a diamond wafer is known as oxygen plasma etching with pattern masking. In oxygen plasma etching, a diamond wafer is lithographically patterned with photoresist or with sputtered Ti—Pt—Au. The masked wafer is placed in a reactor with oxygen under pressure of 1 to 30 mtorr. Microwave powers of 200 to 700 watts and DC biases of −50 to −300 volts are induced in the reactor by applying 13.56 MHz (an FCC allocated frequency) RF power to a cathode. Plasma etching can achieve an etch rate of 5 to 10 microns/hr which is substantially faster than other methods. The influence of various parameters on the etch rate of the diamond wafer is discussed by Pearton et al. in "ECR Plasma Etching of Chemically Vapor Deposited Diamond Thin Films", *Electronics Letters*, 23 Apr. 1992, Vol. 28., No. 9, pp. 822–824. The authors conclude that Ti—Pt—Au is more resistant to etching than photoresist and has other advantages in that it performs a self-aligned contact to the diamond. In any case, however, the plasma etching is highly anisotropic at low pressure and the surface morphology of the diamond is substantially the same after etching as it was prior to etching. That is, pits are not removed.

SUMMARY OF THE INVENTION

It is therefore an object of the invention to provide a new method for ablating a diamond wafer which exploits the rapid etching rate of plasma etching.

It is also an object of the invention to provide a method of ablating a diamond wafer using plasma etching which overcomes the inherent anisotropic nature of plasma etching.

In accord with these objects which will be discussed in detail below, the method of the present invention includes applying colloidal graphite to the surface of a diamond wafer and then subjecting the wafer to an oxygen plasma. Preferably, the oxygen plasma is permitted to remove approximately 50 microns of diamond so that the pits are removed (or more accurately, the diamond between the pits is removed down to the bottom of the pits). Also, the wafer is then preferably mechanically lapped. The resulting surface of the wafer is virtually pit free.

Additional objects and advantages of the invention will become apparent to those skilled in the art upon reference to the detailed description taken in conjunction with the provided figures.

DETAILED DESCRIPTION OF THE PREFERRED EMBODIMENTS

Figure 1:
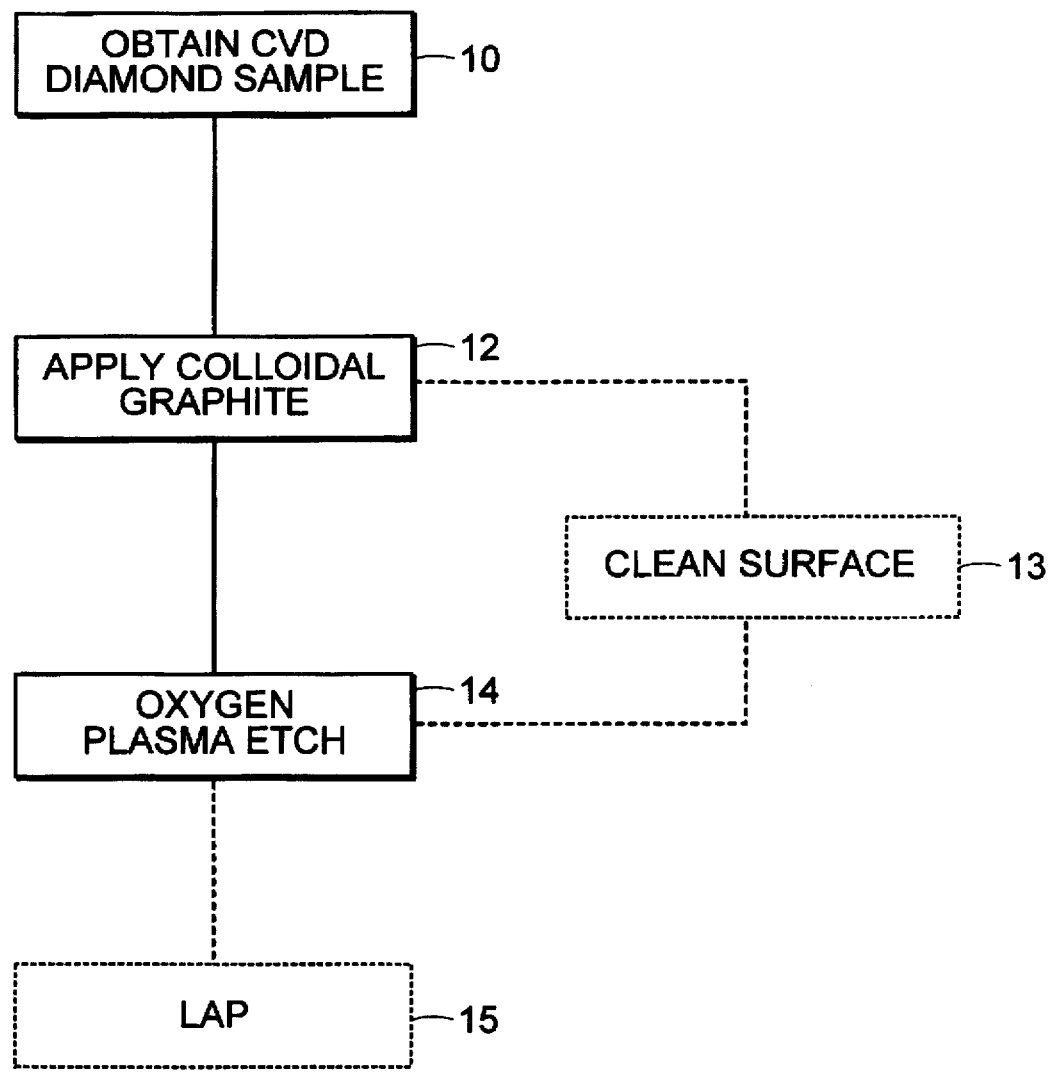
FIG. 1 is a flow chart illustrating the steps of the method.

Turning now to FIG. 1, the method of the invention is seen. At 10, a CVD diamond sample is obtained. Colloidal graphite (graphite particles preferably having a mean diameter of approximately 1 micron suspended in a solvent) is then applied to the surface of the diamond sample at 12. The surface bearing the colloidal graphite is subjected to oxygen plasma etching at 14. Optionally, after applying the colloidal graphite at 12, and prior to plasma etching at 14, the surface bearing the colloidal graphite is cleaned at 13. In addition, after plasma etching at 14, the surface upon which the colloidal graphite was applied is optionally lapped at 15. The described method of the invention will be better understood by reference to the following example.

A diamond wafer formed by a CVD process, and having a diameter of approximately 100 mm was subjected to plasma etching on the substrate side for approximately nine hours. The average removal of diamond from the wafer was approximately 41.0 microns with a standard deviation of approximately 6.5 microns. Commercial grade colloidal graphite (graphite suspended in a solution of water and alcohol) was then applied to a 15 mm wide strip of both sides of the wafer. The wafer was then subjected to a second etching procedure on its deposition side where the average removal of diamond from the wafer was approximately 45.6 microns with a standard deviation of approximately 16.0 microns. The wafer was then subjected to a third etching to remove approximately 50 microns from the deposition side. All of the etchings were performed in a reactor in the presence of oxygen, argon, and $SF_6$ under a pressure of 4 mtorr. Input power to the reactor was held constant at 600 W and the RF bias was held to a constant maximum −118 V. The flow rates of oxygen, argon and $SF_6$ were fixed at 28, 6, and 2 sccm, respectively. The input power to the reactor may be varied from about 500 to 1500 W and the RF bias may be varied from about −100 to −300 V. While oxygen is generally considered to be necessary to the etching process, argon and $SF_6$ may not be necessary to achieve the desired results. Argon is used to help ignite the ECR plasma, but the process will probably work without argon. $SF_6$ prevents the formation of black film which may be acceptable in some applications. The flow rates of oxygen, argon and $SF_6$ may be varied from 20–40, 0–20, and 1–4 sccm, respectively. The pressure of the reactor may be varied from 2–10 mtorr.

After the above described etching treatments were concluded, the wafer was mounted in a lapping machine. The deposition side of the diamond wafer was mechanically lapped for approximately sixty-three hours. Visual inspection of the wafer after lapping revealed an absence of pits on the portion of the wafer which had been coated with colloidal graphite. The wafer was lapped an additional twenty-one hours and micrographs were taken of the lapped surface.

Figure 2:
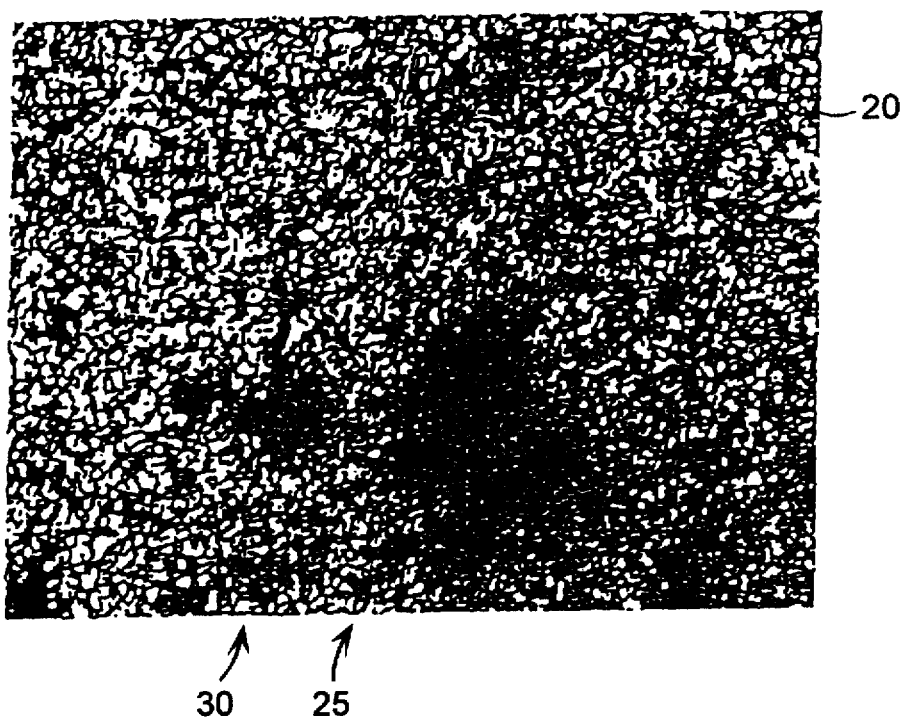
FIG. 2 is a micrograph of the surface of a diamond wafer which was etched without colloidal graphite coating.
Figure 3:
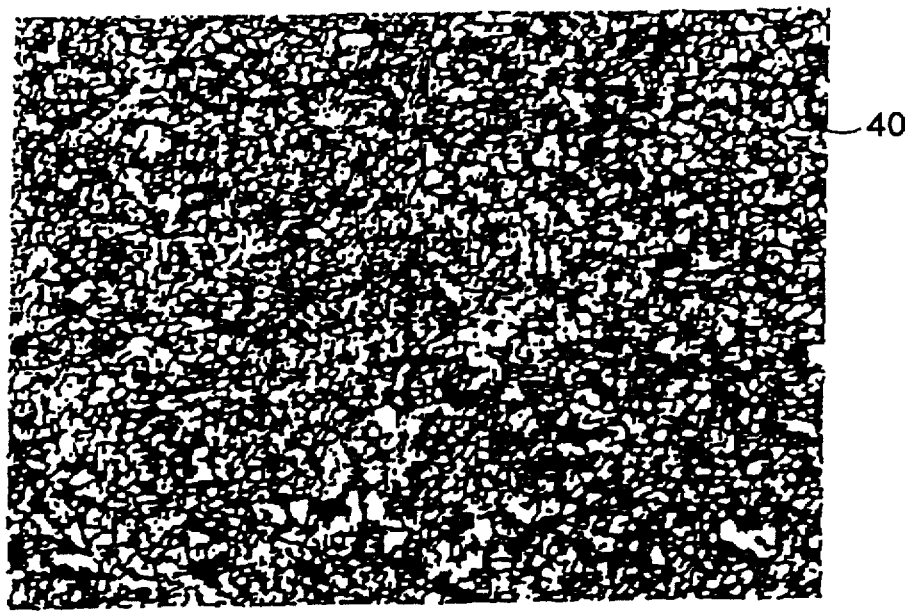
FIG. 3 is a micrograph of the surface of a diamond wafer which was etched after coating with colloidal graphite.

FIG. 2 is a micrograph (65× magnification) of a portion 20 of the deposition side of the diamond wafer which was not coated with colloidal graphite. The large dark spots 25, 30 in FIG. 2 represent pits in the surface of the diamond. These pits are on the order of 50 microns deep. FIG. 3 is a micrograph (65× magnification) of a portion 40 of the deposition side of the diamond wafer which was coated with colloidal graphite. The absence of large dark spots in FIG. 3 represents a pit-free surface of the diamond wafer.

The above procedures were repeated using other diamond samples including a 2 cm square and another 100 mm disk.

Similar results were obtained with each sample. From the foregoing, it is believed that the colloidal graphite coating interacts synergistically with the plasma etching process to reduce the depth of pits on the etched diamond surface. While the results of the procedure are most apparent after the surface is further ablated by lapping, it is believed that significant removal of pits is obtained prior to lapping, as lapping does not remove pits, but simply finishes the surface. In addition, it is noted that ablation methods other than lapping (e.g., grinding or laser ablation) may produce similar results in a diamond sample which has first been subjected to coating with colloidal graphite and then plasma etched.

There have been described and illustrated herein a method for ablating a synthetic diamond, and the synthetic diamonds which result from the method. While particular embodiments of the invention have been described, it is not intended that the invention be limited thereto, as it is intended that the invention be as broad in scope as the art will allow and that the specification be read likewise. Thus, while particular parameters have been disclosed with regard to the plasma etching reactor, it will be appreciated that other parameters could be utilized. Also, while 100 mm disk and 2 cm square diamonds have been shown, it will be recognized that other configurations of diamonds could have their surfaces finished according to the method with similar results obtained. Moreover, while the colloidal graphite used contained particles having a mean diameter of one micron, it will be understood that other particle sizes may achieve the same or similar results. It will therefore be appreciated by those skilled in the art that yet other modifications could be made to the provided invention without deviating from its spirit and scope as so claimed.

What is claimed is:

1. A method for ablating a synthetic diamond comprising:

a) applying colloidal graphite to a surface of the diamond; and b) subjecting the surface of the diamond bearing the colloidal graphite to plasma etching.

2. A method according to claim 1, further comprising:

c) subjecting the surface to ablation after plasma etching.

3. A method according to claim 1, wherein:

said step of subjecting the surface of the diamond to plasma etching includes placing the diamond in a reactor in the presence of oxygen.

4. A method according to claim 3, wherein:

said step of subjecting the surface of the diamond to plasma etching includes placing the diamond in a reactor in the presence of argon and $SF_6$.

5. A method according to claim 4, wherein:

input power to the reactor is approximately 500 to 1500 W and the RF bias is approximately −100 to −300 V, and flow rates of said oxygen, said argon and said $SF_6$ are approximately 20–40, 0–20, and 1–4 sccm, respectively, where etching occurs at a pressure of approximately 2–10 mtorr.

6. A method according to claim 1, wherein:

said step of subjecting the surface of the diamond to plasma etching removes approximately 50 microns from the surface of the diamond.

7. A method according to claim 1, further comprising:

subjecting the surface of the diamond to a preliminary plasma etching prior to said step of applying colloidal graphite to a surface of the diamond.

8. A method according to claim 1, further comprising:

prior to said subjecting, cleaning said surface of the diamond bearing the colloidal graphite.

9. A method according to claim 2, further comprising:

prior to said subjecting, cleaning said surface of the diamond bearing the colloidal graphite.

10. A method according to claim 7, further comprising:

prior to said subjecting, cleaning said surface of the diamond bearing the colloidal graphite.

11. A method according to claim 2, wherein:

said ablation comprises lapping.

12. A synthetic diamond having an ablated surface wherein said surface is ablated according to a process comprising the following steps:

a) applying a colloidal graphite to said surface of said diamond; and b) subjecting said surface of said diamond to plasma etching, such that said ablated surface is substantially pit free.

13. A diamond according to claim 12, wherein said process further comprises:

c) subjecting said surface to ablation after etching.

14. A diamond according to claim 12, wherein:

said step of subjecting said surface of said diamond to plasma etching includes placing said diamond in a reactor in the presence of oxygen.

15. A diamond according to claim 14, wherein:

said step of subjecting said surface of said diamond to plasma etching includes placing said diamond in a reactor in the presence of argon and $SF_6$.

16. A diamond according to claim 15, wherein:

input power to the reactor is approximately 500 to 1500 W and the RF bias is approximately −100 to −300 V, and flow rates of said oxygen, said argon and said $SF_6$ are approximately 20–40, 0–20, and 1–4 sccm, respectively, where etching occurs at a pressure of approximately 2–10 mtorr.

17. A diamond according to claim 12, wherein:

said step of subjecting said surface of said diamond to plasma etching removes approximately 50 microns from said surface of said diamond.

18. A diamond according to claim 12, wherein said process further comprises:

subjecting said surface of said diamond to a preliminary plasma etching prior to said step of applying a colloidal graphite to said surface of said diamond.

19. A diamond according to claim 12, wherein said process further comprises:

prior to said subjecting said diamond surface to plasma etching, cleaning said surface of the diamond bearing the colloidal graphite.

20. A diamond according to claim 13, wherein said process further comprises:

prior to said subjecting said diamond surface to plasma etching, cleaning said surface of the diamond bearing the colloidal graphite.

21. A diamond according to claim 18, wherein said process further comprises:

prior to said subjecting said diamond surface to plasma etching, cleaning said surface of the diamond bearing the colloidal graphite.

22. A diamond according to claim 13, wherein:

said ablation comprises lapping.

* * * * *